United States Patent
Barber et al.

(10) Patent No.: US 7,328,497 B2
(45) Date of Patent: Feb. 12, 2008

(54) INCREMENTAL TUNING PROCESS FOR ELECTRICAL RESONATORS BASED ON MECHANICAL MOTION

(75) Inventors: Bradley Paul Barber, Chatham, NJ (US); Yiu-Huen Wong, Summit, NJ (US)

(73) Assignee: Agere Systems Inc., Allentown, PA (US)

(*) Notice: Subject to any disclaimer, the term of this patent is extended or adjusted under 35 U.S.C. 154(b) by 256 days.

(21) Appl. No.: 11/146,179

(22) Filed: Jun. 6, 2005

(65) Prior Publication Data

US 2005/0224450 A1    Oct. 13, 2005

Related U.S. Application Data

(62) Division of application No. 10/192,420, filed on Jul. 10, 2002, now abandoned, which is a division of application No. 09/961,908, filed on Sep. 24, 2001, now abandoned, which is a division of application No. 09/431,772, filed on Nov. 1, 1999, now Pat. No. 6,339,276.

(51) Int. Cl.
  *H01L 41/047*    (2006.01)
(52) U.S. Cl. .................. 29/594; 29/25.35; 216/13; 216/72
(58) Field of Classification Search ............ 29/25.35, 29/593, 594, 846, DIG. 16; 216/13, 52, 216/72; 333/188, 189; 310/312, 324, 361, 310/364, 370
See application file for complete search history.

(56) References Cited

U.S. PATENT DOCUMENTS

| 3,760,471 A | 9/1973 | Borner ................ 29/25.35 |
| 3,864,161 A | 2/1975 | Thompson ............ 117/212 |
| 3,944,862 A | 3/1976 | Shimoi et al. ....... 310/370 X |
| 4,232,109 A | 11/1980 | Kizaki ................ 216/47 X |
| 4,234,860 A | 11/1980 | Schumacher et al. ... 333/187 |

(Continued)

FOREIGN PATENT DOCUMENTS

JP    52-59290    6/1977    ......... 310/370 X (Continued)

OTHER PUBLICATIONS

IBM Technical Disclosure Bulletin, NB82081697, Device Structure and Fabrication Process for a Fundamental Mode Acoustical, vol. 25, Issue No. 3B, pp. 1697-1700, Aug. 1997.*

(Continued)

*Primary Examiner*—A. Dexter Tugbang
(74) *Attorney, Agent, or Firm*—Steve Mendelsohn

(57) ABSTRACT

A method is provided for adjusting the resonant frequency of a mechanical resonator whose frequency is dependent on the overall resonator thickness. Alternating selective etching is used to remove distinct adjustment layers from a top electrode. One of the electrodes is structured with a plurality of stacked adjustment layers, each of which has distinct etching properties from any adjacent adjustment layers. Also as part of the same invention is a resonator structure in which at least one electrode has a plurality of stacked layers of a material having different etching properties from any adjacent adjustment layers, and each layer has a thickness corresponding to a calculated frequency increment in the resonant frequency of the resonator.

5 Claims, 1 Drawing Sheet

U.S. PATENT DOCUMENTS

| | | | |
|---|---|---|---|
| 4,453,105 A * | 6/1984 | Kogure | 310/361 |
| 4,456,850 A * | 6/1984 | Inoue et al. | 310/324 |
| 4,502,932 A | 3/1985 | Kline et al. | 204/192 EC |
| 4,556,812 A | 12/1985 | Kline et al. | 310/324 |
| 4,719,383 A | 1/1988 | Wang et al. | 310/324 |
| 4,890,370 A | 1/1990 | Fukuda et al. | 29/25.35 |
| 4,988,957 A | 1/1991 | Thompson et al. | 331/107 |
| 5,075,641 A | 12/1991 | Weber et al. | 331/108 C |
| 5,166,646 A | 11/1992 | Avanic et al. | 331/107 A |
| 5,185,589 A | 2/1993 | Krishnaswamy et al. | 333/133 |
| 5,231,327 A | 7/1993 | Ketcham | 310/366 |
| 5,232,571 A | 8/1993 | Braymen | 204/192.22 |
| 5,233,259 A | 8/1993 | Krishnaswamy et al. | 310/324 |
| 5,283,458 A | 2/1994 | Stokes et al. | 257/416 |
| 5,291,159 A | 3/1994 | Vale | 333/188 |
| 5,294,898 A | 3/1994 | Dworsky et al. | 333/187 |
| 5,303,457 A | 4/1994 | Falkner, Jr. et al. | 29/25.35 |
| 5,334,960 A | 8/1994 | Penunuri | 333/193 |
| 5,348,617 A | 9/1994 | Brayman | 156/644 |
| 5,367,308 A | 11/1994 | Weber | 343/700 MS |
| 5,373,268 A | 12/1994 | Dworsky et al. | 333/187 |
| 5,381,385 A | 1/1995 | Greenstein | 367/140 |
| 5,400,001 A | 3/1995 | Asakawa et al. | 333/186 |
| 5,403,701 A | 4/1995 | Lum et al. | 430/315 |
| 5,404,628 A | 4/1995 | Ketcham | 29/25.35 |
| 5,438,554 A | 8/1995 | Seyed-Bolorforosh et al. | 367/140 |
| 5,446,306 A | 8/1995 | Stokes et al. | 257/416 |
| 5,552,655 A | 9/1996 | Stokes et al. | 310/330 |
| 5,587,620 A | 12/1996 | Ruby et al. | 310/346 |
| 5,596,239 A | 1/1997 | Dydyk | 310/311 |
| 5,617,065 A | 4/1997 | Dydyk | 333/186 |
| 5,630,949 A | 5/1997 | Lakin | 216/61 |
| 5,646,583 A | 7/1997 | Seabury et al. | 333/187 |
| 5,692,279 A | 12/1997 | Mang et al. | 29/25.35 |
| 5,698,928 A | 12/1997 | Mang et al. | 310/322 |
| 5,702,775 A | 12/1997 | Anderson et al. | 428/1 |
| 5,714,917 A | 2/1998 | Ella | 332/144 |
| 5,760,663 A | 6/1998 | Pradal | 333/187 |
| 5,780,713 A | 7/1998 | Ruby | 73/1.82 |
| 5,789,845 A | 8/1998 | Wadaka et al. | 310/334 |
| 5,821,833 A | 10/1998 | Lakin | 333/187 |
| 5,853,601 A | 12/1998 | Krishnaswamy et al. | 216/2 |
| 5,864,261 A | 1/1999 | Weber | 333/187 |
| 5,872,493 A | 2/1999 | Ella | 333/191 |
| 5,873,153 A | 2/1999 | Ruby et al. | 29/25.35 |
| 5,873,154 A | 2/1999 | Ylilammi et al. | 29/25.35 |
| 5,883,575 A | 3/1999 | Ruby et al. | 340/572.5 |
| 5,884,378 A | 3/1999 | Dydyk | 29/25.35 |
| 5,894,647 A | 4/1999 | Lakin | 29/25.35 |
| 5,910,756 A | 6/1999 | Ella | 333/133 |
| 5,928,598 A | 7/1999 | Anderson et al. | 264/446 |
| 5,929,555 A | 7/1999 | Sugimoto et al. | 310/360 |
| 5,933,062 A | 8/1999 | Kommrusch | 333/193 |
| 5,942,958 A | 8/1999 | Lakin | 333/189 |
| 5,963,856 A | 10/1999 | Kim | 455/307 |
| 6,051,907 A | 4/2000 | Ylilammi | 310/312 |
| 6,060,818 A | 5/2000 | Ruby et al. | 310/363 |
| 6,081,171 A | 6/2000 | Ella | 333/189 |
| 6,087,198 A | 7/2000 | Panasik | 438/51 |
| 6,127,768 A | 10/2000 | Stoner et al. | 310/313 A |
| 6,150,703 A | 11/2000 | Cushman et al. | 257/415 |
| 6,198,208 B1 | 3/2001 | Yano et al. | 310/358 |
| 6,204,737 B1 | 3/2001 | Ella | 333/187 |
| 6,215,375 B1 | 4/2001 | Larson, III et al. | 333/187 |

FOREIGN PATENT DOCUMENTS

| | | | |
|---|---|---|---|
| JP | 56-18429 | 2/1981 | 216/47 X |

OTHER PUBLICATIONS

Sauerland, F.L., "Automatic Frequency Control in Chemical Etching of Quartz Crystal Blanks", Fourth-Fourth Annual Symposium on Frequency Control, pp. 246-250, May 1990.*

* cited by examiner

INCREMENTAL TUNING PROCESS FOR ELECTRICAL RESONATORS BASED ON MECHANICAL MOTION

CROSS-REFERENCE TO RELATED APPLICATIONS

This is a divisional of U.S. patent application Ser. No. 10/192,420, filed on Jul. 10, 2002 now abandoned as which is itself a divisional of U.S. patent application Ser. No. 09/961,908, filed on Sep. 24, 2001 as (now abandoned), which is itself a divisional of U.S. patent application Ser. No. 09/431,772, filed on Nov. 1, 1999 as (issued as U.S. Pat. No. 6,339,276), the teachings of all of which are incorporated herein by reference.

BACKGROUND OF THE INVENTION

1. Field of the Invention

This invention relates to electrical resonators employing a mechanical transducer and more particularly to a method for fine tuning such resonators following batch fabrication.

2. Description of the Related Art

The need to reduce the cost and size of electronic equipment has led to a continuing need for ever smaller filter elements. Consumer electronics such as cellular telephones and miniature radios place severe limitations on both the size and cost of the components contained therein. Many such devices utilize filters that must be tuned to precise frequencies. Hence, there has been a continuing effort to provide inexpensive, compact filter units.

One class of filter element that meets these needs is constructed from mechanical resonators such as acoustic resonators. These devices use acoustic waves, bulk longitudinal waves for example, in thin film material, typically but not exclusively piezoelectric (PZ) material. In one simple configuration, a layer of PZ material is sandwiched between two metal electrodes. The resonator may be suspended in air, supported along its rim, or may be placed on an acoustic mirror comprised of a plurality of alternating layers of high and low acoustic impedance (the product of speed and density), usually silicon dioxide and aluminum nitride. When an electric field is applied between the two electrodes via an impressed voltage, the PZ material converts some of the electrical energy into mechanical energy in the form of sound waves. For certain crystal orientations, such as having the c axis parallel to the thickness of an Aluminum Nitride film, the sound waves propagate in the same direction as the electric field and reflect off of the electrode/air or electrode/mirror interface.

At a certain frequency which is a function of the resonator thickness the forward and returning waves add constructively to produce a mechanical resonance and because of the coupling between mechanical strain and charge produced at the surface of a piezoelectric material, the device behaves as an electronic resonator; hence, such devices combined in known architectures can act as a filter. The fundamental mechanical resonant frequency is that for which the half wavelength of the sound waves propagating in the device is equal to the total thickness of the piezoelectric plus electrode layers. Since the velocity of sound is many orders of magnitude smaller than the velocity of light, the resulting resonator can be more compact than dielectric cavity resonators. Resonators for 50 Ohm matched applications in the GHz range may be constructed with physical dimensions approximately 100 micrometers in diameter and few micrometers in thickness.

The resonant frequency of the resonator is a function of the acoustic path of the resonator. The acoustic path is determined by the distances between the outer surfaces of the electrodes. When batch producing resonators on a substrate, the thickness of the transducing material and the electrodes is fixed at fabrication; hence, the resultant resonance frequency is also fixed. Since there are variations in thickness from device to device resulting from manufacturing tolerances, some method for fine tuning the resonance frequency of each device is needed.

To compensate for this inability to reliably and inexpensively mass produce resonators with the proper resonance characteristics, it is known to intentionally produce resonators having a lesser thickness than the thickness indicated to achieve a desirable resonant frequency, and then deposit excess material on at least one of the electrodes to change the overall thickness of the device and thereby fine tune the device. As this deposition of material may be done while the device is subjected to an input signal and simultaneously tested for resonance this method has produced acceptable results.

This method is not, however without problems as the presence of a mask needed to control the deposition over the desired electrodes creates problems of its own. If the mask, for instance is in contact with the electrode, the mask mass is added to the device mass and alters the resonance characteristics of the device. On the other hand if the mask is not in contact with the device the control of the deposition area suffers. Such masking techniques have been successful with quartz type resonators that are much larger, but have not been as successful with resonators of the order of less than one millimeter.

It has also been proposed to remove material from the device in order to adjust its resonant frequency by etching material off the top electrode of a resonator. With current technology, however, etching is not as controlled a process as deposition. Etching tends to be less uniform, smooth or reproducible than deposition. In fact prolonged etching may in cases change the composition, morphology, grain nature or roughness of thin films. Accurate etching processes require precise knowledge of the rate at which material is removed to permit stopping at the exact moment that sufficient material has been removed to produce the desired resonant frequency. To a certain extent lack of precise control of the etching rate may be alleviated by monitoring the device frequency during the etching process.

When removal of material is done in a dry etching process it is usually possible to monitor the resonant frequency of the device during the etching process. However, monitoring of the resonant frequency during etching is not possible when wet etching processes are used. Wet processes are desirable as they are much faster than dry processes.

There is thus still a need for a process to accurately fine tune a mechanical resonator to a desired frequency without concern for possible over-etching and without need to monitor the frequency during the etching process.

SUMMARY OF THE INVENTION

The above object is obtained in accordance with this invention by a method for adjusting the resonant frequency of a mechanical resonator, the method comprising using alternating selective etching to remove distinct adjustment layers from an electrode comprising a plurality of stacked adjustment layers, each of said adjustment layers having distinct etching properties from any adjacent adjustment layers.

Such a process alleviates the need to know the precise rate of etching in a particular process because etching will stop when the etching process removes all the material of one layer and reaches the next layer that is selected to be impervious to the etching process. In other words the etching stops each time at the barrier, i.e. the change from one material to another, as each layer is sequentially removed.

Because the stacked layers have been created by deposition of material on the top electrode, complete removal of each layer maintains the uniformity of the remaining layer obtained during the deposition of this layer. The composition and morphology of the unetched layer film remains ideal.

In more detail, the proposed method is a method of manufacturing a mechanical resonator having a desired resonant frequency by a process comprising:
(a) forming a first electrode;
(b) forming a transducer layer over the first electrode;
(c) forming a second electrode with a plurality of discreet layers of known thickness, each having etching properties different from at least one other;
(d) sequentially etching a calculated number of the discreet layers thereby incrementally reducing the resonator overall thickness by a known amount to adjust the resonator resonant frequency to the desired resonant frequency.

The distinct layers are composed of materials that have different etching properties and have thickness calculated to represent a selected fractional increment of the resonant frequency.

More particularly the present method includes first forming the second electrode with an initial conductive electrode layer having a thickness calculated to produce a resonator having a first resonant frequency that is higher than the desired resonant frequency. Subsequently, calculating a desired thickness for an adjustment layer such that when the adjustment layer is placed over the first conductive layer the resonant frequency of the resonator is reduced by a selected frequency increment. This selected frequency increment is a small fraction of the desired frequency correction for the resonator.

Having determined the thickness and number of adjustment layers to produce over the conductive layer sufficient to bring the top electrode thickness to a point such that the resonant frequency of the resonator is below the desired resonant frequency, each of these layers is created using materials having etching properties different from the etching properties of any adjacent adjustment layers. Then, the actual resonant frequency of the resonator is measured and the number of adjustment layers to be removed to incrementally adjust the actual resonator frequency to the desired resonant frequency determined.

Once this number is known, the process according to this invention comprises sequentially selectively etching the calculated number of adjustment layers to adjust the resonator resonant frequency to a desired frequency.

The terms "different etching properties" and "selective etching" as used herein mean that the materials used may be etched using an etching process for one that does not effect the other, so that one material can be removed completely without substantially effecting the other. Thus selective etching is the process of subjecting two or more materials to an etching process that effects only one of the materials.

It is a further objective of this invention to provide a method as hereinabove described, wherein there are at least two resonators electrically connected and wherein the step of forming said adjustment layers comprises forming a first plurality of stacked alternating adjustment layers having first and second etching properties on one of said at least two resonators, and forming a second plurality of stacked alternating adjustment layers having third and fourth etching properties, and alternatively selectively etching said first and said second pluralities of alternating stacked layers to remove said calculated number of adjustment layers to adjust the resonator resonant frequency to a different desired frequency for each of said at least two resonators.

It is also an object of the present invention to provide a mechanical resonator comprising a first electrode, a transducer and a second electrode wherein the second electrode comprises a conductive layer and a plurality of distinct stacked adjustment layers, each of the adjustment layers having distinct etching properties from any adjacent adjustment layers. Preferably, the first electrode is a bottom electrode placed over a supporting substrate, and the second electrode is a top electrode over the transducer.

The mechanical resonator resonant frequency is a function of the resonator thickness and the stacked adjustment layers each have a thickness such that removal of an adjustment layer increases the resonant frequency by a known increment.

The adjustment layer thickness may be uniform for all layers, or may decrease for adjustment layers closest to the conductive layer.

BRIEF DESCRIPTION OF THE DRAWINGS

The invention can be more fully understood from the following description thereof in connection with the accompanying drawings described as follows.

DETAILED DESCRIPTION

Figure 1:
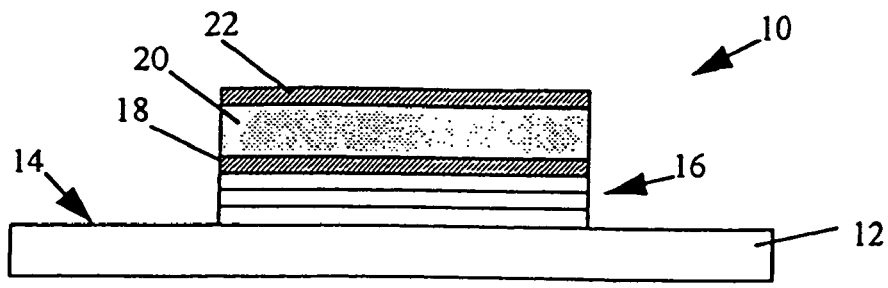
FIG. 1 shows a cross section of a typical resonator.

Throughout the following detailed description, similar reference characters refer to similar elements in all figures of the drawings. Depending on the thin film materials used, additional layers of insulation, protective films, encapsulation, etc. may be required and all such layers and films have been omitted herein for simplification and better understanding of the invention. The specific structure and fabrication method illustrated is for exemplary purposes only and other methods of fabricating a resonator and or filter in accordance with the present invention can be devised including but not limited to substrate etching, adjustment layers, reflecting impedance matching layers, etc. U.S. Pat. No. 5,373,268, issued Dec. 13, 1994, with the title "Thin Film Resonator Having Stacked Acoustic Reflecting Impedance Matching Layers and Method", discloses a method of fabricating thin film resonators on a substrate.

Referring now to FIG. 1, there is shown a typical structure of a mechanical resonator 10 on a support 12. The resonator structure comprises a substrate 12 having an upper planar surface 14. Substrate 12 can be any convenient material that is easily workable, e.g. any of the well known semiconductor materials. In the present specific example, substrate 12 is a silicon wafer normally used for fabricating semiconductor products. Other materials useful as resonator supports include, inter alia, glass, quartz, sapphire or high resistivity silicon In the example illustrated in FIG. 1, a plurality of alternating layers of SiO2 and AlN, ending with a SiO2 uppermost layer, form an acoustic reflective mirror 16. Each of the mirror layers has a typical thickness that is a ¼ wavelength of the filter's central frequency. For PCS cellular phone applications this frequency is 1.9 gigahertz.

The use of an acoustic mirror of course, is not the only way to make a resonator. What is needed, and what the acoustic mirror provides, is good acoustic reflection at the boundaries of the transducer layer. Other techniques to achieve this are known in the art, including using a solid to air interface. Air against most solids produces the required acoustic reflection. For example, one can also make an acoustic resonator by thin film deposition of the resonator material on a substrate of Si and subsequent removal of the layers beneath the resonator by: a) back etching away the Si or b) deposition of a sacrificial layer beneath the resonator which is removed by subsequent preferential etching. The present invention is directed to resonator tuning by selective etching techniques, and applies to all resonators regardless of their structure.

A conductive layer forming bottom electrode 18 is deposited and patterned (if required) on the surface of the acoustic mirror. A mechanical transducer layer 20, such as a piezoelectric layer, is next coated over the bottom electrode, and a conductive layer 22 is coated over the transducer layer and patterned to form the resonator 10.

In the figures used to explain the present invention the different layers have been shown as co-extensive layers extending only in the area of the resonator. This is done to avoid cluttering the illustrations. In most applications, as is well known to the person skilled in this art, the piezoelectric layer is coated as a continuous conforming layer over the bottom electrode, the acoustical mirror, if present, and the support. Similarly the acoustic layers may extend past the bottom electrode on either side. The transducer is defined by the combination of elements between the top and bottom electrodes in the area under the top electrode. With the exception of the top electrode any of these elements may be layers extending outside the top electrode covered area with little effect on the resonator characteristics.

The top electrode may be a single conductive layer 22 as shown or a composite of more than one preferably coextensive layers, at least one of which is conductive, preferably the layer in contact with the transducer layer.

The manner of fabrication of the above described layers and resonator structure is well known in the resonator fabrication art. The different layers can for example be fabricated utilizing any of the well known techniques, such as, vacuum deposition of a convenient material, electroless deposition, etc., followed by masking and etching to created desired patterns.

Because piezoelectric materials are the most commonly used transducer materials, we describe this invention using a piezoelectric material for the transducer. Such use is not, however, intended to limit the invention to piezoelectric transducers. Other transducers such a magnetostrictive or electrostrictive may equally well be used in resonator designs and the teachings of this invention apply equally well to structures that incorporate different transducer materials. What is significant is that the transducer material used results in a resonator having a resonant frequency that is dependent on the overall thickness of the resonator, which thickness includes both the transducer thickness and the electrode thickness.

The person skilled in the art will recognize that the resonators may be substantially more complex than illustrated, however the structure as represented is sufficient to explain the invention, any omitted features such as details of the resonator supports, connections, protective layers etc. being well known in the art as previously mentioned.

Figure 2:
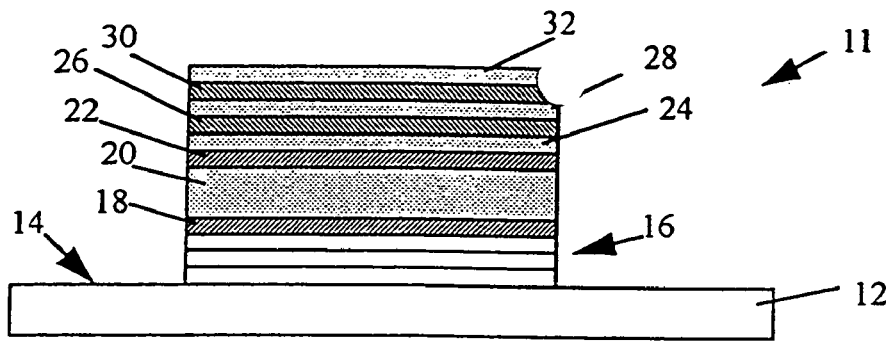
FIG. 2 shows a cross section of a resonator in which the top electrode is structured with multiple layers in accordance with an embodiment of the present invention.

FIG. 2 illustrates the first step in adjusting the resonant frequency of a batch produced resonator according to the present invention. The batch produced resonator will have a structure similar to the structure shown in FIG. 1. The combined thickness of the bottom electrode 18, the transducer layer 20 and the top conductive layer 22 are calculated such that the resonant frequency of the resonator 10 as batch produced is above a desired frequency, $f_d$. The actual frequency is next, if so desired, measured and a thickness of the top electrode sufficient to bring the resonant frequency to a second frequency $f_s$ below the desired frequency calculated. In the alternative, the second frequency may be simply estimated, without measuring the actual batch produced resonator frequency, by providing a sufficient number of stacked layer to reduce the resonant frequency to well below the desired one. Next a number of layers of material preferably co-extensive with the top electrode are deposited on the top electrode. This can be preferably achieved by depositing all layers and then masking once and patterning the entirety in one etching sequence. The thickness of each of the deposited layers is calculated to produce a known incremental change in the resonant frequency. Thus as shown in FIG. 2 five additional layers have been deposited over the top electrode 22 bringing the resonant frequency of the resonator below the desired resonant frequency.

As illustrated in FIG. 2 the added layers are distinct layers of materials having different etching properties. Thus for example layer 18 may be an aluminum layer, layer 24 a gold layer, then again layer 26 an aluminum layer, layer 28 a gold layer, and again layer 30 an aluminum layer and layer 32 a gold layer.

Figure 3:
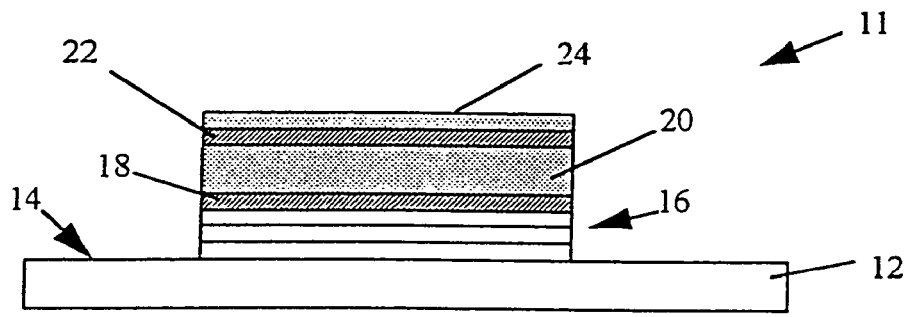
FIG. 3 shows the resonator according to FIG. 2 after it has been adjusted to a desired resonant frequency according to this invention.

Because the incremental effect of each layer to the resonant frequency of the resonator is known, one can now measure the frequency of the resonator 11 with the top electrode layers as shown in FIG. 2 and then determine how many layers must be removed to obtain the desired frequency for this resonator. Assuming that four layers have been determined that they must be removed, the resonator may be first subjected to a first etching process whereby the process only etches the gold electrode. Thus only one layer will be removed in this step as shown in FIG. 3. Next the resonator is subjected to a second etching process removing the now exposed aluminum layer 30 until the layer is completely removed, and the next gold layer exposed. The process is repeated as many times as needed to remove the calculated number of layers resulting in a resonator as shown in FIG. 3 wherein the top electrode is shown as having two layers only.

This process is particularly useful in cases where it is not possible to monitor the shift in frequency of the resonator during etching to obtain fine tuning of batch produced resonators, as is typically the case where wet, or chemical vapor etching is used. The ability to accurately use wet chemical etching with predictable results allows more flexibility in materials selection for the top electrode of resonators and higher manufacturing speeds.

In one application of this technique, resonators having resonant frequencies that differ by a small amount may be produced in a single batch, and their differing resonant frequencies easily adjusted for each by removing different numbers of layers to obtain the slight shift in resonant frequency required in certain combinations of multiple resonators.

Figure 4:
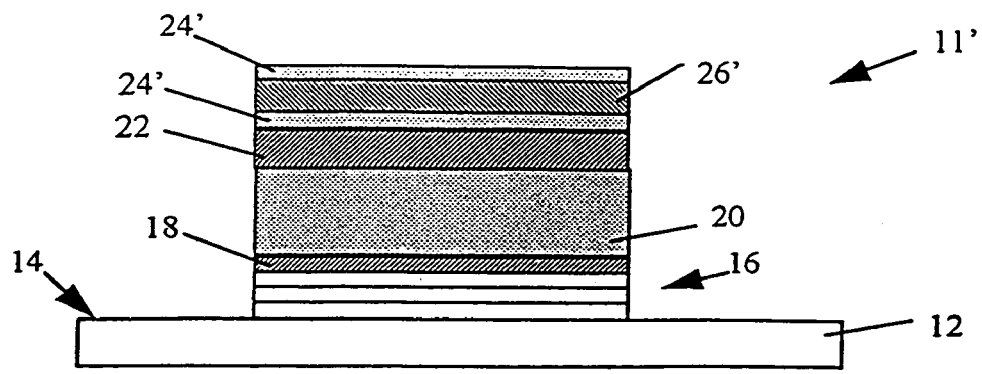
FIG. 4 shows a cross section of a resonator of an alternate embodiment of this invention in which the top electrode is structure with multiple layers of different thickness.

FIG. 4 shows, in admittedly exaggerated form, an alternate embodiment of this invention in which the layers added to the top conductive layer 22 have different thickness. Different thickness may be resorted to, depending on the material used and the ability to control the thickness uniformity of each layer during the deposition. Thus the gold layer 24' over the aluminum layer 22 may have a first thickness that is less than the thickness of the next aluminum layer 26' and so on. According to this invention the thickness of the adjustment layers will be determined by the desired end result, the materials and the etching processes available and does not have to be identical for all layers.

According to the present invention a different material is used for alternating layers of the top electrodes. In the simplest case different metals are used for each electrode but the desired effect of selective etching can also be achieved using both conductive and non conductive layers, as well as using more than a combination of two different materials.

Aluminum and gold are etched in different etchants, therefore pairing aluminum and gold for the top electrode layers allows the eventual selective etching of each electrode to obtain the necessary incremental frequency adjustment. The same is true for the pair Aluminum and SiO2.

Removal of excess electrode thickness is done by etching the excess material from the top layer. Selective etching according to this invention may be accomplished using RIE with combinations of gasses that etch the different layers selectively. For example, Chlorine based chemistry, will not etch SiO2 as fast as Aluminum. Fluorine based chemistry on the other hand will. One can thus use chlorine to etch the aluminum top layers and fluorine for the SiO2 sequentially until after a number of pre-calculated cycles sufficient layers have been removed to obtain the desired resonant frequency.

Reactive ion etching or vapor phase etching are typically used because they would permit the simultaneous testing of the resonator while it is being etched. Testing for resonant frequencies may sometimes be impractical as for instance in cases where multiple resonators are used in an electrical circuit and access to a particular resonator may be physically difficult. The present invention alleviates the need for continuous monitoring of the etching process since the process terminates automatically when all of the layer has been removed. Naturally monitoring may still be performed when using the present invention, and still reap the advantages of automatic termination of the etching process each time a layer is totally removed, as discussed in the summary of the invention above.

The present invention, therefore, permits the accurate use of other etching techniques such as wet and vapor chemical etching.

Wet etching by dipping the parts in solution offers the advantage of speed and can also be used to practice this invention. A subsequent timed immersion of sufficient length removes a layer and stops. Next the resonator is dipped in a different bath and the next layer removed. And so on until the desired number of layers are removed. The baths may be EDTA Peroxide to etch a titanium layer, and PAE etch for aluminum, in cases where the layers are alternating layers of aluminum and titanium. If a gold layer is used, a potassium iodide/iodine bath can be used for the gold layer.

Vapor phase etch is another possible process and tools exist and can be used. Similar chemistry to the wet etch example above can be used.

Etching is well known technology not requiring further discussion herein, as shown by the following two treatises: Vossen and Kern, *Thin film processes*; Academic Press, San Diego 1978 and by the same authors, *Thin film processes II*, Academic Press, San Diego 1991.

Single resonators are useful for single frequency applications such as oscillators or other very narrow frequency applications. In some cases there is need to tune two resonators to two different frequencies to make broader bandwidth filters. According to the present invention, in such filters, one resonator is made of alternating Ti and Al stacked layers calculated as hereinabove described, and the other is Au and SiO2. By use of combinations of nonselective removal such as Ar RIE or chemical mechanical polishing (CMP) and the selectivity of EDTA/peroxide for Ti, PAE for Al, KI/I for Au, and chlorine based RIE for Al, one can perform the incremental tuning of this invention on each resonator separately without interfering with the other. Other pairs of materials and etching process may of course be used the above been given by way of illustration rather than limitation.

The invention has heretofore been described with reference to specific materials and etching processes. Such description is only for the purpose of explaining our invention and the person skilled in the art will recognize that there are alternate ways to practice this invention. For example, while the description of the resonator refers to a top and a bottom electrode, with the stacked layers comprising the top electrode, it is also possible in resonator structures where the etching process can be applied to either electrode that the stacked layers may be part of either or both electrodes. Such modifications are to be construed as being encompassed within the scope of the present invention as set forth in the appended claims wherein we claim:

We claim:

1. A method of manufacturing a mechanical resonator having a desired resonant frequency, the method comprising:
    forming a first electrode;
    forming a transducer layer over the first electrode;
    forming a second electrode having a plurality of discrete layers of known thickness, each of the discrete layers having etching properties different from at least one other of the discrete layers;
    sequentially etching a calculated number of the discrete layers in order to incrementally reduce the resonator overall thickness by a known amount to adjust a resonator resonant frequency to the desired resonant frequency, wherein the step of forming the second electrode discrete layers further comprises:
        forming a first conductive electrode layer having a thickness calculated to produce a resonator having a first resonant frequency that is higher than the desired resonant frequency;
        calculating a desired thickness for an adjustment layer such that, when the adjustment layer is placed over the first conductive layer, the resonant frequency of the resonator is reduced by a selected frequency increment;
        forming a plurality of adjustment layers over the conductive layer sufficient to produce a second electrode thickness such that the resonant frequency of the resonator is below the desired resonant frequency, each of the adjustment layers having etching properties different from the etching properties of any adjacent adjustment layers;

measuring an actual resonant frequency of the resonator and calculating a number of adjustment layers to be removed to incrementally adjust the actual resonator frequency to the desired resonant frequency; and sequentially selectively etching the calculated number of adjustment layers to adjust the resonator resonant frequency to the desired resonant frequency.

2. The method according to claim 1, further comprising calculating the thickness of each of the discrete layers to represent a selected frequency increment of the resonant frequency.

3. The method according to claim 1, wherein the plurality of adjustment layers are alternating layers of two materials having distinct etching properties.

4. The method according to claim 1, wherein the etching is a wet etching process.

5. The method according to claim 1, wherein:

there are at least two resonators electrically connected; and the step of forming the adjustment layers comprises:

forming a first plurality of stacked alternating adjustment layers having first and second etching properties on one of the at least two resonators;

forming a second plurality of stacked alternating adjustment layers having third and fourth etching properties; and alternatively selectively etching the first and said second pluralities of alternating stacked layers to remove the calculated number of adjustment layers to adjust the resonator resonant frequency to a different desired frequency for each of the at least two resonators.

* * * * *